United States Patent
Ajmera et al.

(12)

(10) Patent No.: US 7,476,602 B2
(45) Date of Patent: Jan. 13, 2009

(54) $N_2$ BASED PLASMA TREATMENT FOR ENHANCED SIDEWALL SMOOTHING AND PORE SEALING POROUS LOW-K DIELECTRIC FILMS

(75) Inventors: Sameer Kumar Ajmera, Richardson, TX (US); Patricia Beauregard Smith, Colleyville, TX (US); Changming Jin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 119 days.

(21) Appl. No.: 11/046,230

(22) Filed: Jan. 31, 2005

(65) Prior Publication Data

US 2006/0172552 A1 Aug. 3, 2006

(51) Int. Cl.
*H01L 21/26* (2006.01)
*H01L 21/42* (2006.01)
(52) U.S. Cl. .............. 438/513; 438/680; 438/687; 257/E21.009; 257/E21.23; 257/E21.229; 257/E21.17; 257/E21.319

(58) Field of Classification Search .......... 438/513, 438/197, 381, 524, 678, 689, 692, 687, 706, 438/745, 700, 778, 680
See application file for complete search history.

(56) References Cited

U.S. PATENT DOCUMENTS

| | | | |
|---|---|---|---|
| 5,693,563 A * | 12/1997 | Teong | 438/687 |
| 5,904,565 A * | 5/1999 | Nguyen et al. | 438/687 |
| 6,159,842 A | 12/2000 | Chang et al. | |
| 6,284,657 B1 * | 9/2001 | Chooi et al. | 438/687 |
| 6,455,417 B1 * | 9/2002 | Bao et al. | 438/637 |
| 6,677,251 B1 * | 1/2004 | Lu et al. | 438/778 |
| 6,686,272 B1 * | 2/2004 | Lee et al. | 438/636 |
| 6,805,139 B1 * | 10/2004 | Savas et al. | 134/1.3 |
| 6,927,178 B2 * | 8/2005 | Kim et al. | 438/778 |

\* cited by examiner

*Primary Examiner*—David Nhu
(74) *Attorney, Agent, or Firm*—Jacqueline J. Garner; W. James Brady, III; Frederick J. Telecky, Jr.

(57) ABSTRACT

A method of forming a semiconductor device including forming a low-k dielectric material over a substrate, depositing a liner on a portion of the low-k dielectric material, and exposing the liner to a plasma. The method also includes depositing a layer over the liner.

12 Claims, 5 Drawing Sheets

N₂ BASED PLASMA TREATMENT FOR ENHANCED SIDEWALL SMOOTHING AND PORE SEALING POROUS LOW-K DIELECTRIC FILMS

FIELD OF THE INVENTION

The present invention relates to semiconductor devices and methods for improving the reliability of semiconductor devices and, more particularly, relates to semiconductor devices and method for forming semiconductor devices with improved porous low-k dielectric layers.

BACKGROUND OF THE INVENTION

The desire for higher packing densities, faster circuit speed, and lower power dissipation has driven the scaling of semiconductor devices to smaller dimensions. As these devices, such as, for example, metal-oxide-semiconductor field effect transistors (MOSFETs) become smaller, different materials are required to perform the needed functions. This has led to low-k dielectric materials and high conductivity metals being used in the devices.

Many current low-k dielectrics and next generation ultra-low dielectric constant (ULK) dielectrics, however, typically are porous. This porosity often leads to exposed pores and surface roughness in, and on, trench and via surfaces and sidewalls. Additionally, formation of trench and via structures can expose and open pores and form defects such as excessive side-wall roughness or micro-trenching at the surface, trench/via bottom, and on trench/via sidewalls of the dielectric. Exposed pores and defects can provide entry points for inter-calation and diffusion into the dielectric of unwanted species from the fabrication environment or processing. These unwanted species can serve to compromise the chemical, structural, and/or electrical integrity of the dielectric, raise the effective dielectric constant of the dielectric, increase leakage currents, limit device lifetime and reliability, and/or interact detrimentally with downstream fabrication chemistries. Further, as a result of surface roughness and open porosity, it is difficult for subsequent thin films to smoothly cover and deposit, defect free, on the low-k dielectric film.

Copper diffusion barriers are often deposited on low-k dielectrics to prevent copper from diffusing into the low-k dielectric. Copper diffusion barriers, however, must be very thin while still maintaining good integrity in order to function properly. When deposited over rough or porous surfaces, the copper diffusion barrier often is deposited with defects, such as "pin-holes", cracks, breaks, thin-spots, or incomplete coverage which compromise the integrity and functionality of the barrier layer. Moreover, low-k dielectrics that have exposed pores or the like are susceptible to diffusion of the barrier precursor materials into the internal matrix of the porous low-k dielectric. This can lead to an increase in leakage current and a decrease in reliability lifetime of the device.

A conventional method and device are shown in FIGS. 1A-1D. As shown in FIG. 1A, a porous low-k dielectric material 20 is formed on a substrate 10. A recess 30 with sidewalls 32 is patterned and formed in low-k dielectric material 20 so as to expose a portion of substrate 10 at a bottom 34 of recess 30. However, pores and defects 50a form in and on the surface of the low-k dielectric 20 during fabrication as a result of the inherent porosity and roughness of the dielectric, and also as a result of subsequent etching of the low-k dielectric material 20. As shown in FIG. 1B, after forming recess 30 a copper diffusion barrier 40 is typically deposited over low-k dielectric material 20 and in recess 30 so as to cover the exposed substrate 10 at bottom 34 and sidewalls 32. As can be seen in FIG. 1B, defects 50b typically form in the copper diffusion barrier 40 as a result of the high porosity, roughness, and defects 50a of the low-k dielectric material 20.

Previous attempts to improve devices have included a plasma treatment 35 of the porous low-k dielectric material 20, as shown in FIG. 1C. The plasma treatment, however, has had limited success. For example, prior plasma treatments directly to porous low-k dielectric materials, and especially to porous ULK layers, can lead to densification or damage layers that extend tens to hundreds of nanometers into the dielectric layer. Densification leads to increased k-value due to the reduction of porosity. "Damage," as used herein, refers to the depletion of carbon and/or other elements that originally served to lower the dielectric constant. "Damage" can also refer to the increase of silanol (Si—OH) bonds that drive increases in the dielectric constant. Generally, "damaged" dielectrics have an increased k-value. Typically, lower k dielectric materials and porous dielectric materials are more susceptible to plasma damage than are dielectrics with less porosity and/or higher k values. The net result has been that while successful pore sealing through plasma treatments has been demonstrated, it has come at a cost of increased k-values. As such, the benefit of using low-k materials, and thus practical implementation of this solution, has not been achieved.

Another attempted solution, as shown in FIG. 1D, has been to try to seal the pores using a trench/via liner, also called a pore-sealing liner, 60. Typical materials used for liner 60 have a dielectric constant between 2.9 and 6.8. An example of a conventional liner material is silicon nitride. When pore-sealing liners have been used in the past, however, pores and defects 50a in low-k dielectric material 20 cause trench liner 60 to also have defects, as shown in FIG. 1D with label 50c. Defects 50c in trench liner 60 correspond to defects or pores 50a in material 20. Further, barrier layer 40 formed over trench liner 60 also has defects 50b that correspond to the defects 50c in trench liner 60 and pores and defects 50a in porous low-k dielectric material 20. To overcome this, thicker trench liners have been used to fill in the pores and eliminate defects. However, typical trench liner materials negatively impact interconnect performance because by nature, they have a higher k-value than the low-k dielectric 20. Unfortunately, using thicker liners only increases the negative impact of the higher-k material. As a result, the use of trench liner 60 as a pore-sealing material has been impractical.

Attempts have also been made to use low-k dielectric materials as a trench liner as well. However, these materials by nature are porous and thus add additional defects to the system.

Thus, there is a need to overcome these and other problems of the prior art and to provide semiconductor devices with improved porous low-k dielectric layers.

SUMMARY OF THE INVENTION

According to various embodiments, the present teachings include a method of forming a semiconductor device including forming a first layer comprising a first low-k dielectric over a substrate, exposing the first low-k dielectric to a plasma comprising nitrogen, and forming a material over the first layer.

According to various embodiments, the present teachings also include a method of forming a semiconductor device including forming a low-k or ULK dielectric over a substrate, depositing a liner on a portion of the dielectric, and exposing the liner to a plasma. The method also includes depositing a material over the liner.

According to various embodiments, the present teachings also include a semiconductor device including a first dielectric layer formed on a substrate and a nitrogen plasma treated liner deposited over the first dielectric layer. The device also includes a first conductive layer deposited over the nitrogen plasma treated liner and a second material deposited over the first conductive layer.

Additional advantages of the invention will be set forth in part in the description which follows, and in part will be obvious from the description, or may be learned by practice of the invention. Some of the advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain various principles of the invention. Further, they do not limit the scope of the invention to the specific structures and layers illustrated and described but serve to delineate only one example. For example, even though a trench structure and trench liner is shown, this invention and subsequent embodiments apply to via structures and dual damascene structures as well. As another example, even though the trench structure is shown being formed down to the substrate, this invention and subsequent embodiments apply to recess structures that have a bottom surface that is shallow in the substrate or deep into the substrate. Further, the recess can have various profiles, such as rounded or sharp corners, straight or curved sidewalls, and vertical or angled sidewalls.

DESCRIPTION OF THE EMBODIMENTS

Reference will now be made in detail to exemplary embodiments of the invention, examples of which are illustrated in the accompanying drawings. Wherever possible, the same reference numbers will be used throughout the drawings to refer to the same or like parts.

Figure 2A:
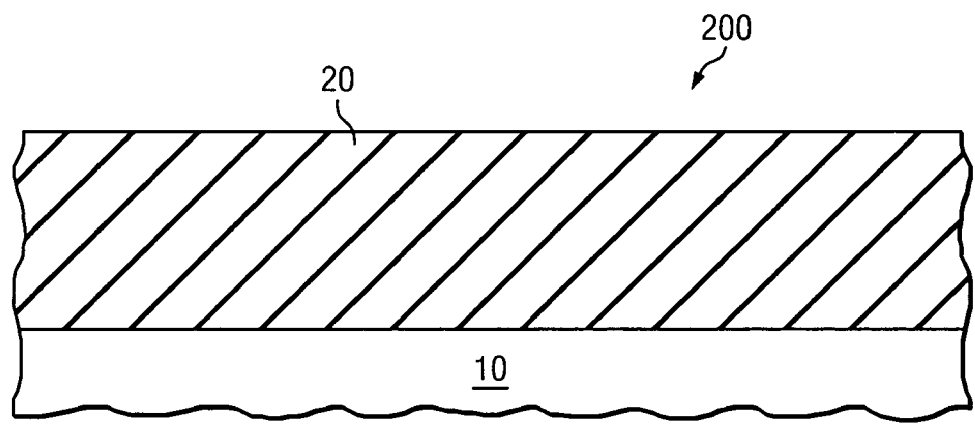
FIG. 2A depicts a cross sectional view of a step in a method for forming a device having a low-k dielectric according to various embodiments of the invention.

FIGS. 2A-2G depict a structure 200 and the steps for making a semiconductor device according to embodiments of the invention. As shown in FIG. 2A, a first material 20 is formed over a substrate 10. Substrate 10 typically represents all potential incoming material and devices in semiconductor manufacturing such as silicon, silicon germanium, gallium arsenide, and/or silicon-on-insulator bulk substrates, and/or components such as transistors, capacitors, resistors, other circuitry, other semiconductor devices, metallization, and/or other layers of interconnect and dielectrics and/or layered combinations of all of these materials and components.

Figure 2B:
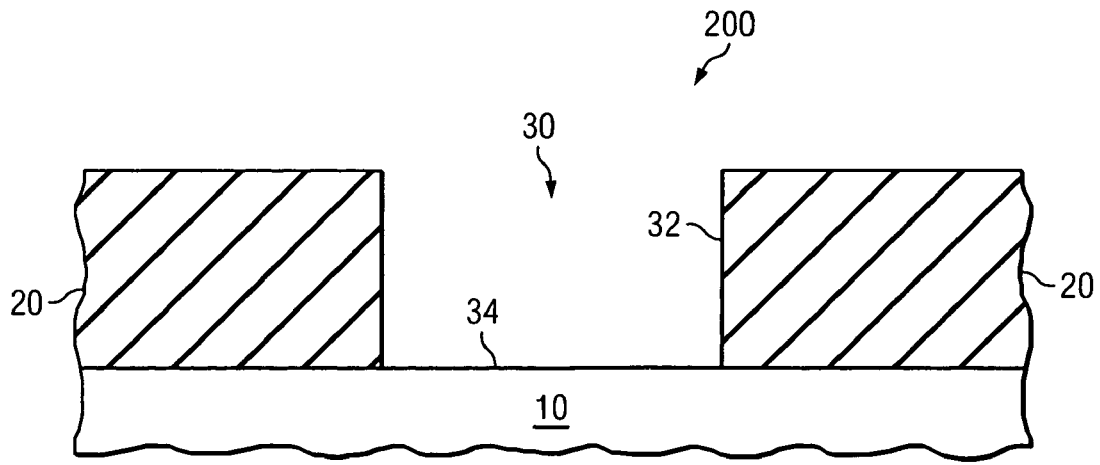
FIG. 2B depicts a cross sectional view of a step in a method for forming a device having a low-k dielectric according to various embodiments of the invention.
Figure 2C:
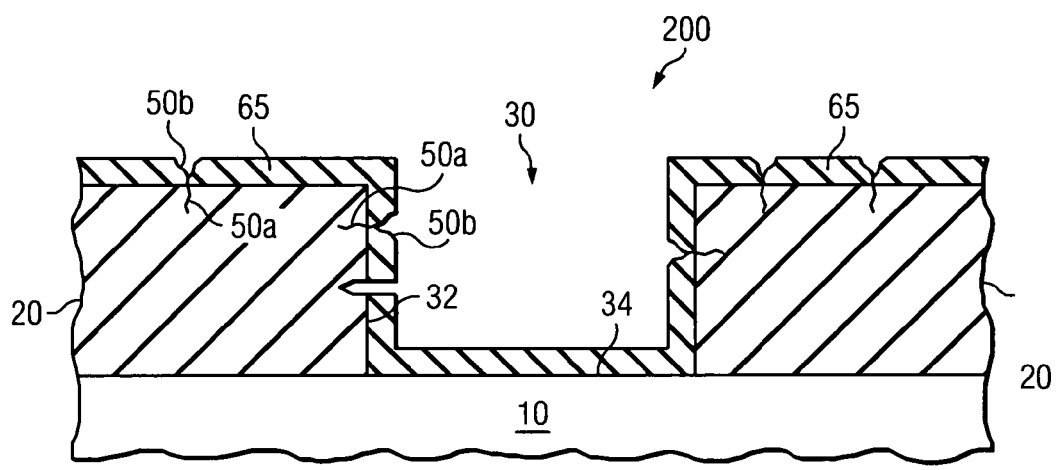
FIG. 2C depicts a cross sectional view of a step in a method for forming a device having a low-k dielectric according to various embodiments of the invention.

As shown in FIG. 2B, a recess 30 can be etched in first material 20 so as to form a trench or a via. Recess 30 can be formed according to methods known in the art, such as photolithography and etching. Recess 30 can include sidewalls 32 and bottom 34. As shown in FIG. 2C, a first layer 65 can be deposited over first material 20. In various embodiments first layer 65 can be a liner such as a pore sealing liner.

According to various embodiments, the first layer 65 can comprise a low-k dielectric material. As used herein, the term "low-k dielectric" refers to a dielectric material whose dielectric constant is 3.1 or less, and in still further instances, 2.6 or less. Exemplary low-k dielectric materials include plasma enhanced chemical vapor deposited (PECVD) carbon doped oxides and organosilicate glasses (OSG) such as Applied Materials, Inc. Black Diamond™, Novellus Systems, Inc. CORAL™ OSG, or spin-on silsesquioxanes such as HSQ and MSQ such as JSR Micro, Inc. LKD5109™. Organo-polymer based dielectrics such as Dow Chemical Co. SiLK™ can also be used. However, any dielectric material with basic properties that are compatible with standard semiconductor manufacturing methods and materials can be employed in an embodiment of this invention.

First layer 65 can be formed with a first surface of the first layer proximate to first material 20 and/or substrate 10 and a second surface away from first material 20 and/or substrate 10 by various techniques. Some exemplary techniques include various deposition methods, such as, for example, chemical vapor deposition (CVD), chemical liquid deposition (CLD), or atomic layer deposition (ALD). First layer 65 can also be formed over first material 20 by spin-on techniques. According to various embodiments, first layer 65 can have a thickness from 10 Angstroms to 500 Angstroms, and more particularly, from 10 Angstroms to 100 Angstroms. These thicknesses are exemplary and are not intended to be limiting of the various embodiments.

According to various embodiments first material 20 can comprise a metal, semiconductor, or insulator and in certain embodiments, first material 20 can comprise a low-k dielectric similar but not necessarily identical to the first layer 65, as described herein. First material 20 can more typically comprise a porous low k dielectric or porous ULK such as porous carbon doped oxides, porous organosilicate glasses, porous organo-polymers, or porous silsesquioxane based dielectrics. First material 20 can be formed using techniques similar to those used to form first layer 65 or other deposition techniques different from that used to form first layer 65.

Figure 2D:
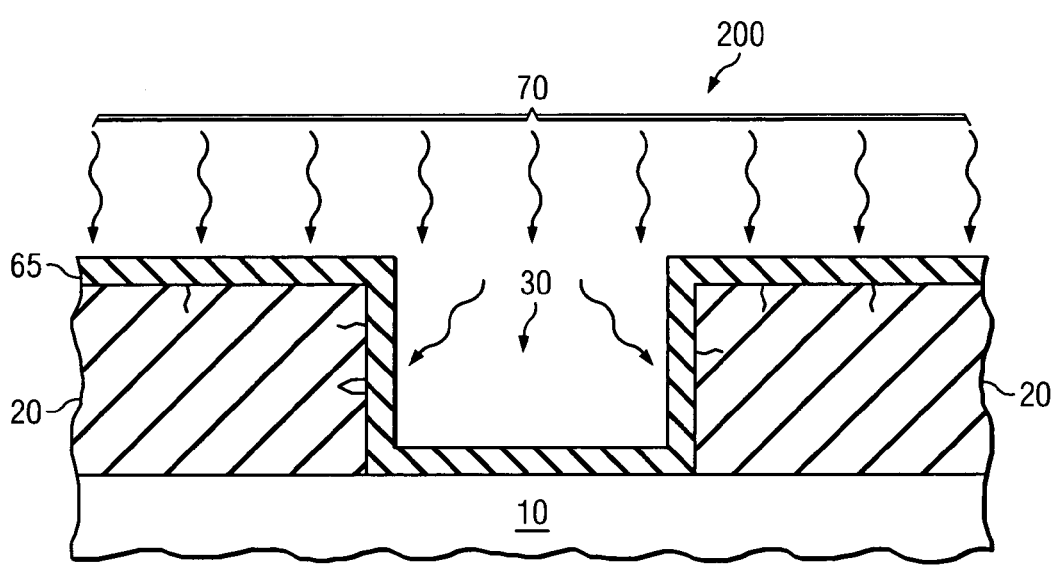
FIG. 2D depicts a cross sectional view of a step in a method for forming a device having a low-k dielectric according to various embodiments of the invention.

As shown in FIG. 2D, structure 200 is exposed to a plasma 70. Plasma 70 can comprise nitrogen and/or $N_2$ and, in certain embodiments, plasma 70 can comprise nitrogen and/or $N_2$ exclusively or in combination with other elements such as helium and other inert gases such as neon, argon, krypton, xenon, and other inert gases as will be known to those of ordinary skill in the art, or other reactive gases such as $NH_3$ or other N-containing gases from which the N could be liberated in the presence of a plasma. According to various embodiments, plasma 70 can be formed using a source power from 500 Watts to 1500 watts, a substrate bias power from 0 Watts to 200 Watts, and a pressure from 1 mTorr to 100 mTorr. Plasma 70 can be applied from 1 second to 120 seconds.

Figure 2E:
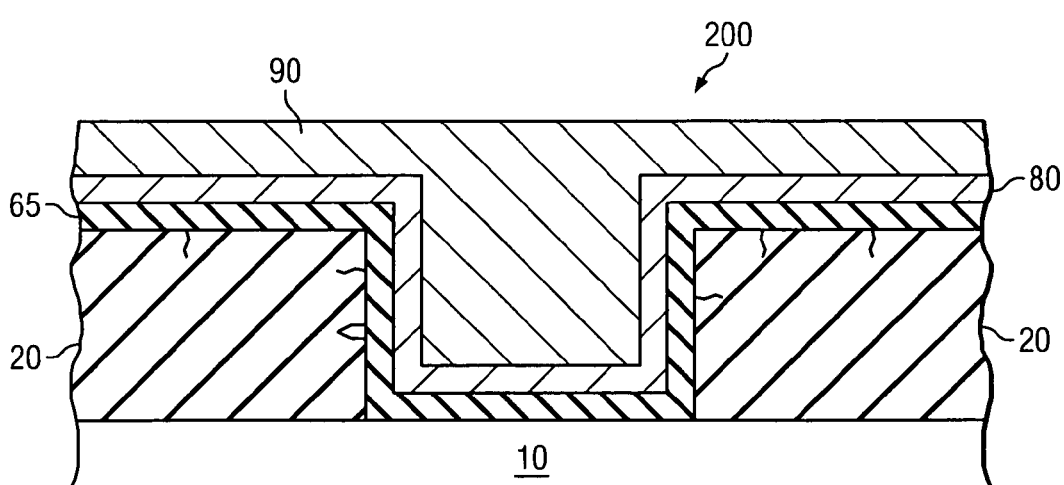
FIG. 2E depicts a cross sectional view of a step in a method for forming a device having a low-k dielectric according to various embodiments of the invention.

FIG. 2E shows an optional barrier layer 80, such as a copper diffusion barrier layer, formed over first layer 65. Various barrier layers as are known in the art can be used. For example, barrier layer 80 can be a copper diffusion barrier material comprising at least one of tantalum, tungsten, titanium, tantalum nitride, tantalum silicon nitride, titanium nitride, titanium silicon nitride, tungsten nitride, tungsten silicon nitride, or tungsten carbide. Barrier layer 80 can be formed using a variety of techniques, such as, for example, CVD, physical vapor deposition (PVD), or atomic layer deposition (ALD). Barrier layer 80 can have a thickness of from 10 to 300 Angstroms. As mentioned, barrier layer 80 is optional and can be formed over the entire first layer 65, over a portion of first layer 65, or barrier layer 80 may not be formed at all.

FIG. 2E also shows a second layer 90 formed over substrate 10. A portion of second layer 90 can fill recess 30. According to various embodiments, second layer 90 can be a metal, semiconductor, or insulator. In instances where second layer 90 is a metal, it can comprise copper.

Figure 2F:
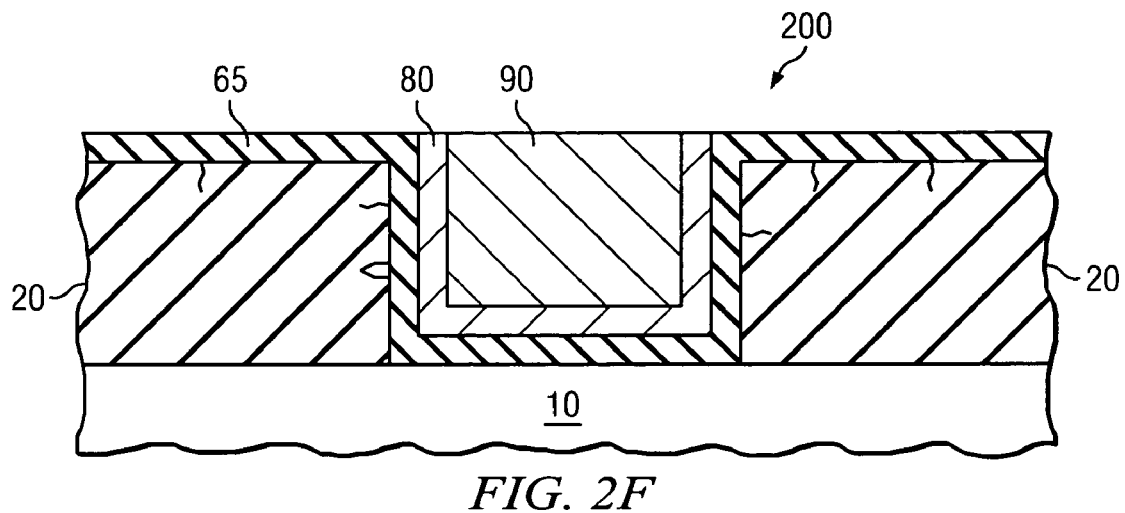
FIG. 2F depicts a cross sectional view of a step in a method for forming a device having a low-k dielectric according to various embodiments of the invention.
Figure 2G:
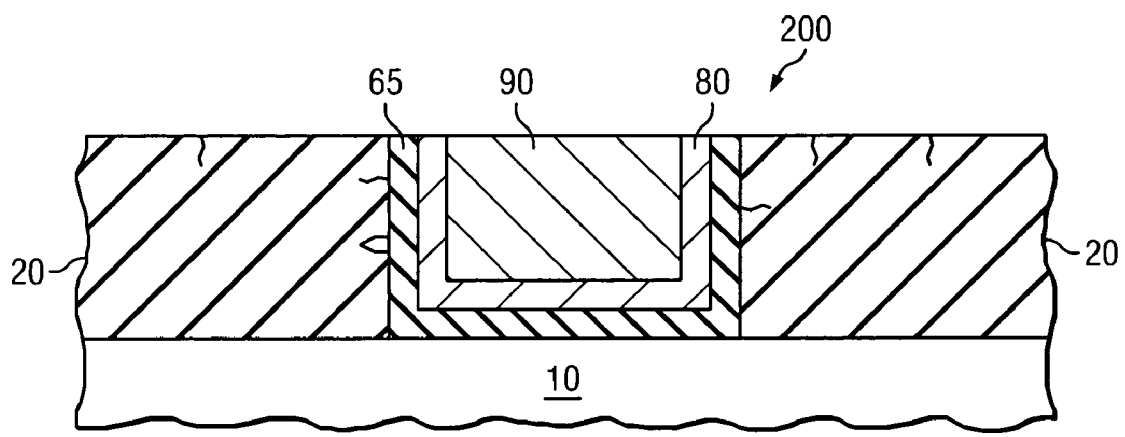
FIG. 2G depicts a cross sectional view of a step in a method for forming a device having a low-k dielectric according to various embodiments of the invention.

As shown in FIG. 2F, when second layer 90 fills recess 30, second layer 90 can be removed from the area over first material 20. In this case, the structure 200 can be planarized so that second layer 90 is removed from areas over first material 20. Moreover, barrier layer 80, when used, can also be removed from areas over first material 20, also shown in FIG. 2F. And in certain embodiments as shown in FIG. 2G, first layer 65 can be planarized and/or removed from over first material 20. Suitable removal techniques are known to one of ordinary skill in the art. Exemplary techniques include chemical mechanical polishing (CMP), wet etching, and dry etching.

It will be understood by one skilled in the art that even though a trench structure is shown, this invention and subsequent embodiments apply to via structures and dual damascene structures as well. Further, the illustration of the recess structure stopping directly on substrate 10 is merely for exemplary purposes only. Recess 30, or other open structures in other embodiments, can have a recess bottom shallow of the substrate or deep in to the substrate.

According to various embodiments as shown, for example in FIG. 2C, the recess bottom 34 can stop directly on substrate 10 and first layer 65 can be formed directly on substrate 10. For example, when first material 20 is used, recess 30 is formed in first material 20 and first layer 65 is formed on substrate 10 on bottom 34 of recesses 30. As also shown in FIG. 2C, first layer 65 can be formed on sidewalls 32 of recess 30. In various embodiments where first material 20 is not used, first layer 65 can be formed directly on substrate 10.

According to various embodiments, low-k dielectric materials can be porous when formed. For example as shown in FIG. 2C, first layer 65 and/or first material 20 can comprise a low-k dielectric and can have pores and defects 50a. Further first layer 65 can also comprise pores and defects 50b. Further, low-k dielectric materials can acquire defects as a result of etching. However, using plasma treatments described herein, the low-k dielectric material such as first layer 65 and first material 20, and in particular, the surface of the low-k dielectric layer 65 can be modified, physically and/or chemically, so as to mend defects, seal pores, and/or smooth sidewalls.

Figure 1A:
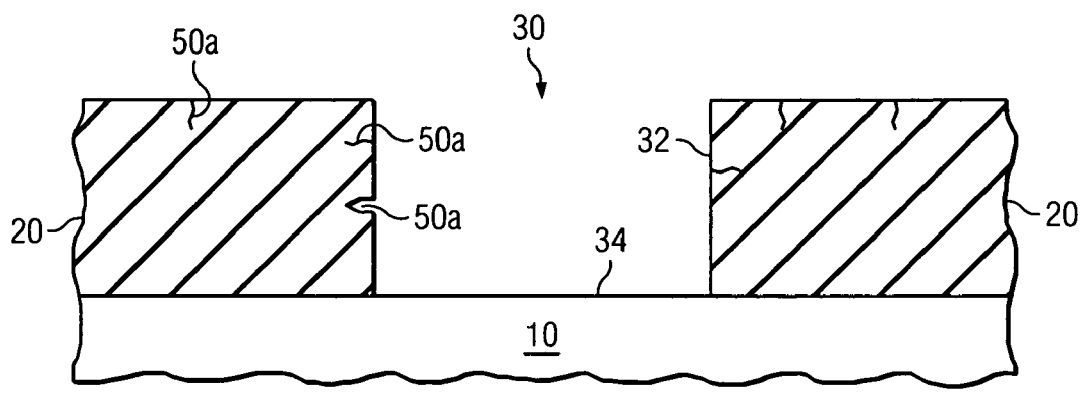
FIG. 1A depicts a cross sectional view of a conventional method for forming a device having a porous low-k dielectric material.
Figure 1B:
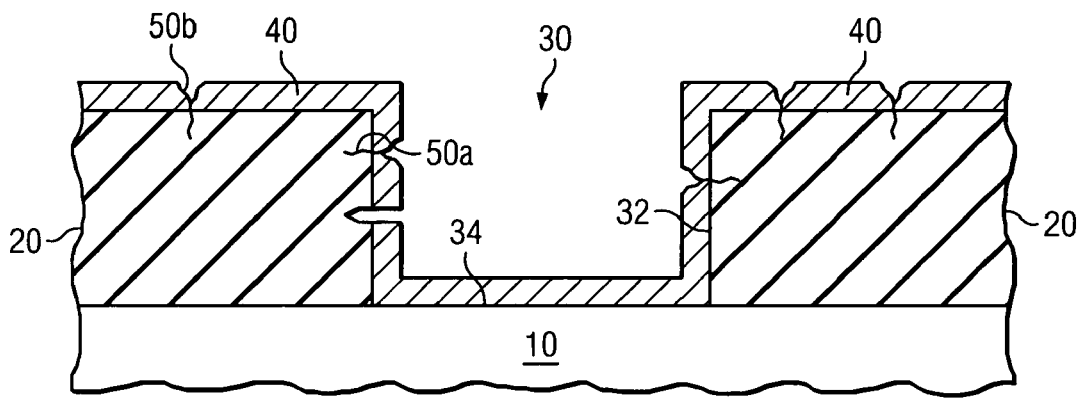
FIG. 1B depicts a cross sectional view of another conventional method for forming a device having a porous low-k dielectric material.
Figure 1C:
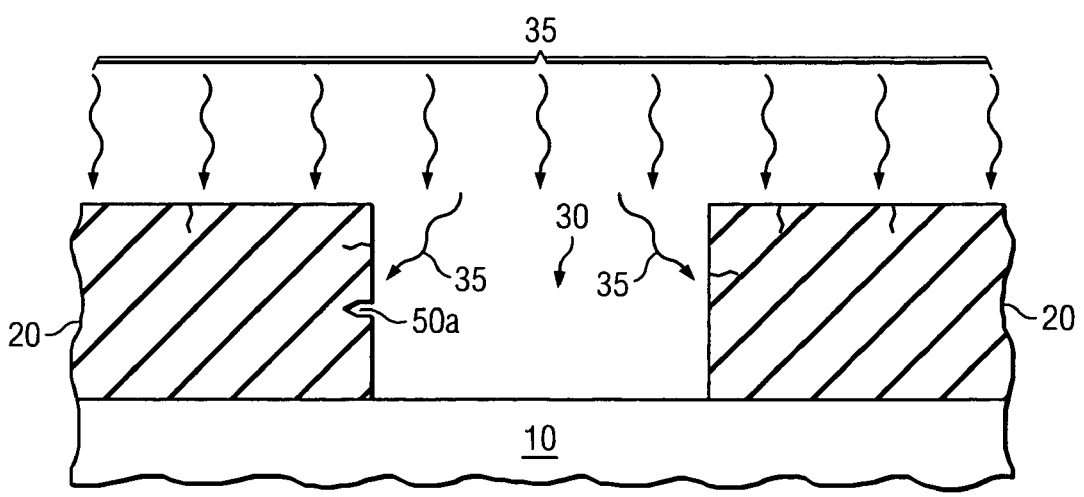
FIG. 1C depicts a cross sectional view of yet another conventional method for forming a device having a porous low-k dielectric material.
Figure 1D:
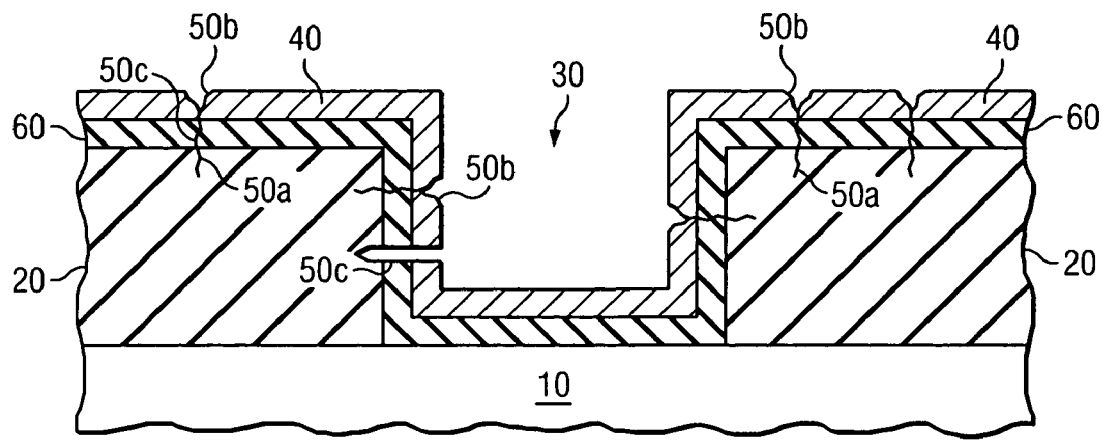
FIG. 1D depicts a cross sectional view of yet another conventional method for forming a device having a porous low-k dielectric material.

For example, typical low-k liners, such as as-deposited plasma enhanced chemical vapor deposited (PECVD) AMAT Black Diamond™, which has a dielectric constant of about 2.9, are by themselves porous or semi-porous and are not good liner materials. Further, conventional direct plasma exposure to the porous dielectric 20 or the use of a low-k pore sealing liner like 60 shown in FIG. 1D by themselves are impractical. However, various embodiments described herein permit a low-k dielectric material that could not be previously utilized as an effective liner to act as a pore-sealing and side-wall smoothing layer without being excessively thick or having an excessively large dielectric constant. For example, plasma 70 can advantageously lessen the porosity of first layer 65 at a region on the surface of the layer without damaging the porous low-k material 20 underneath. In a further example, the porosity of first layer 65 can be made less than that of first material 20. Moreover, the dielectric constant of first material 20 can be the same as or less than that of the low-k first layer 65. In this way, embodiments described herein permit a practical pore-sealing solution to integrate porous low-k dielectrics that does not unacceptably increase the overall effective dielectric constant of the structure, component, and/or device. And in certain embodiments, modified first layer 65 can serve as both a barrier layer and a liner. In this case, barrier layer 80 need not be formed.

Modifying the low-k dielectric surface can inhibit second layer 90, such as copper, from detrimentally contacting substrate 10 or first material 20, or improve the integrity of barrier layer 80 if used. Moreover, modifying the low-k dielectric surface can inhibit the diffusion of copper into the low-k dielectric or into the material the low-k dielectric covers. As such, a liner made from a low-k dielectric having sealed pores and smoothed sidewalls can be used to improve device performance.

Various plasmas 70 can be used, including plasmas having a material comprising nitrogen and/or $N_2$. Alternatively, plasmas can comprise helium. Other plasmas as described herein can also be used.

Figure 3A:
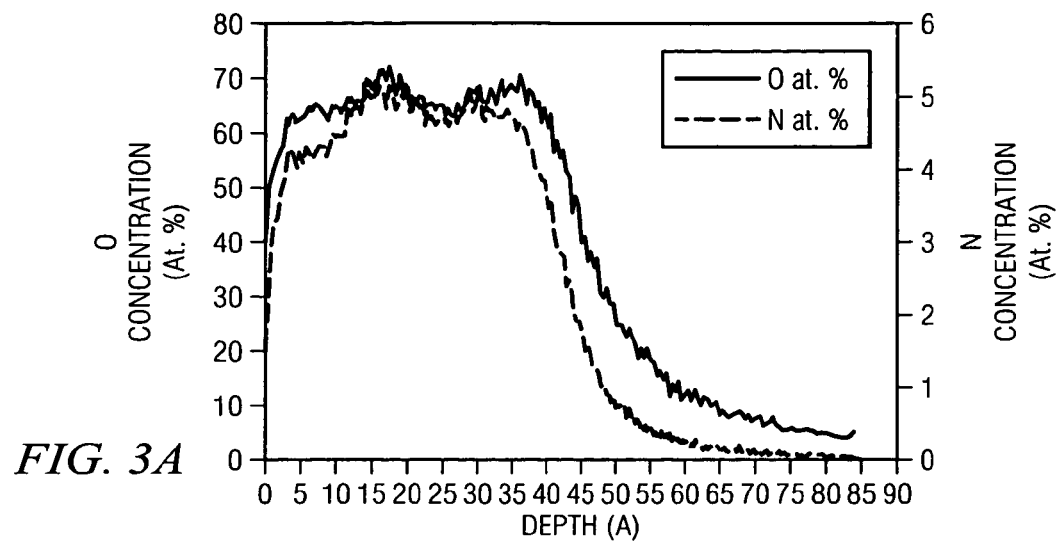
FIG. 3A depicts a secondary ion mass spectroscopy measurement of a low-k dielectric treated with a plasma according to an embodiment of the invention.
Figure 3B:
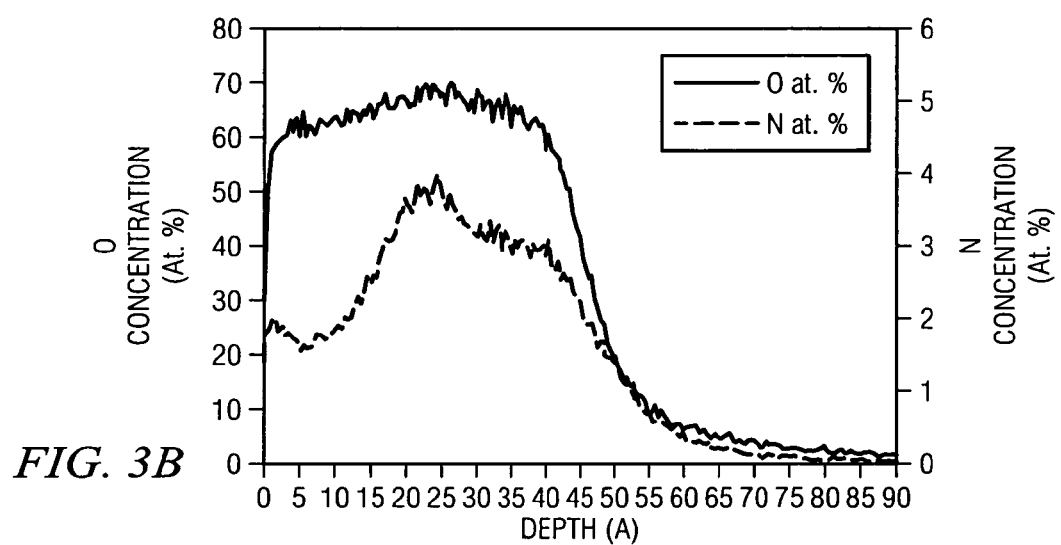
FIG. 3B depicts a secondary ion mass spectroscopy measurement of a low-k dielectric treated with a plasma according to another embodiment of the invention.
Figure 3C:
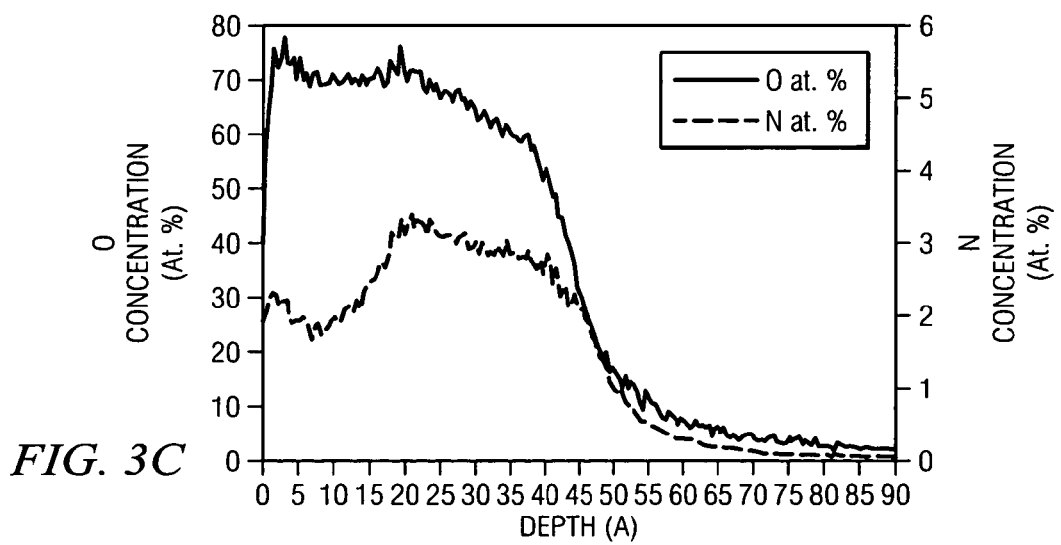
FIG. 3C depicts a secondary ion mass spectroscopy measurement of a low-k dielectric not treated with a plasma.

FIGS. 3A-3C show various secondary ion mass spectroscopy (SIMS) results of a low-k dielectric material, such as Black Diamond™, exposed to plasma 70. FIG. 3A shows SIMS results after plasma 70 treatment comprising $N_2$. As a result of the $N_2$ plasma treatment, there is a nitrogen concentration of about 5.0 atomic %±0.5 atomic % in the first 40 Angstroms of the exposed low-k dielectric. As shown in FIG. 3B, as a result of helium plasma treatment, there is a nitrogen concentration of about 2.0% to 4.0% in the first 40 Angstroms of the exposed low-k dielectric. And FIG. 3C shows a nitrogen concentration of about 1.5 to 3.5% atomic % at the first 40 Angstroms of the low-k dielectric not exposed to plasma 70. FIG. 3A shows a clear increase in nitrogen concentration with the $N_2$ plasma treatment over the unexposed sample FIG. 3C within the first 40 angstroms of the film and especially within the first 25 angstroms of the film. Moreover, results of transmission electron microscopy (TEM) show that the surface of the plasma treated low-k dielectrics is densified as is seen by a contrast difference in the similar region as where the SIMS measurements showed an increased concentration of nitrogen. An acceptable technique for measuring both atomic concentration and relative film densities is high resolution TEM with high resolution Electron Energy Loss Spectroscopy (EELS). Other acceptable techniques to qualitatively or quantitatively measure thin film density and/or porosity include positron annihilation lifetime spectroscopy (PALS), ellipsometric porosimetry (EP), X-ray Reflectometry (XRR), and/or underlayer degassing through the thin film with a mass spectrometer detector.

The above description describes various examples of effects of plasma treatment to the low-k dielectric material. However, these descriptions are provided only for illustrative purposes. Varying the plasma energy, composition, pressure, as well as other variables permits the low-k dielectric to be modified to varying degrees. As such, plasma 70 can be used to enhance the performance of low-k dielectric materials.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a semiconductor device comprising:
    forming a first layer comprising a first low-k dielectric over a substrate with a first surface
    exposing the first low-k dielectric to a plasma comprising nitrogen wherein the first layer comprises a nitrogen concentration of from 4.5 to 5.5 atomic percent at a depth of about 40 Angstroms away from the first surface and
    depositing a second layer over the first layer.

2. A method of forming a semiconductor device comprising:
    forming a low-k dielectric material over a substrate;
    depositing a liner on a portion of the low-k dielectric material;
    exposing the liner to a plasma;
    and depositing a layer over the liner, wherein the liner comprises a first surface and a second surface, the first surface contacting the low-k dielectric material, and wherein the liner has a thickness from 10 Angstroms to 100 Angstroms, and further wherein the liner comprises a nitrogen concentration from 4.5 to 5.5 atomic percent at a depth of about 40 Angstroms away from the second surface.

3. The method of forming a semiconductor device of claim 2 wherein the plasma comprises of at least one of nitrogen or $N_2$.

4. The method of forming a semiconductor device of claim 2, wherein the plasma comprises helium (He).

5. The method of forming a semiconductor device of claim 2, wherein the plasma comprises nitrogen and at least one other gas selected from helium, argon or another inert gas.

6. The method of forming a semiconductor device of claim 2, wherein the plasma comprises a nitrogen containing gas that liberates N atoms in the plasma.

7. The method of forming a semiconductor device of claim 2 further comprising:
    forming a recess in the low-k dielectric material, wherein a portion of the liner material is deposited on a sidewall of the recess.

8. The method of forming a semiconductor device of claim 3, wherein the plasma is formed using a source power from 500 Watts to 1500 Watts, a substrate bias power from 0 Watts to 200 Watts, a pressure from 1 mTorr to 100 mTorr, and a time from 1 second to 120 seconds.

9. The method of forming a semiconductor device of claim 2, wherein the liner comprises a material having a dielectric constant of 3.1 and below.

10. The method of forming a semiconductor device of claim 2, wherein the layer comprises copper.

11. The method of forming a semiconductor device of claim 2 further comprising:
    forming a barrier material over the liner material.

12. A method of forming a semiconductor device comprising:
    forming a low-k dielectric material over a substrate;
    depositing a liner on a portion of the low-k dielectric material;
    exposing the liner to a plasma;
    and depositing a layer over the liner, wherein the liner comprises a first surface and a second surface, the first surface contacting the low-k dielectric material, and wherein a density of the liner at the second surface is greater than the density of the liner at the first surface.

* * * * *